United States Patent
Bayan et al.

(10) Patent No.: US 8,293,573 B2
(45) Date of Patent: Oct. 23, 2012

(54) MICROARRAY PACKAGE WITH PLATED CONTACT PEDESTALS

(75) Inventors: Jaime A. Bayan, San Francisco, CA (US); Nghia Thuc Tu, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 12/688,590

(22) Filed: Jan. 15, 2010

(65) Prior Publication Data

US 2010/0136749 A1    Jun. 3, 2010

Related U.S. Application Data

(62) Division of application No. 11/893,764, filed on Aug. 17, 2007, now Pat. No. 7,671,452.

(51) Int. Cl.
*H01L 21/00* (2006.01)
(52) U.S. Cl. .............................. 438/107; 257/E21.506
(58) Field of Classification Search ................. None
See application file for complete search history.

(56) References Cited

U.S. PATENT DOCUMENTS

| | | |
|---|---|---|
| 5,900,676 A | 5/1999 | Kweon et al. |
| 6,238,952 B1 | 5/2001 | Lin |
| 6,437,429 B1 | 8/2002 | Su et al. |
| 6,451,627 B1 | 9/2002 | Coffman |
| 6,528,893 B2 | 3/2003 | Jung et al. |
| 6,562,660 B1 | 5/2003 | Sakamoto et al. |
| 6,975,038 B1 | 12/2005 | Mostafazadeh |
| 7,226,811 B1 | 6/2007 | McLellan et al. |
| 7,271,032 B1 | 9/2007 | McLellan et al. |
| 2003/0015780 A1 | 1/2003 | Kang et al. |
| 2008/0048311 A1 | 2/2008 | Ikenaga et al. |

OTHER PUBLICATIONS

U.S. Appl. No. 12/688,597, filed Jan. 15, 2010.

*Primary Examiner* — Benjamin Sandvik
(74) *Attorney, Agent, or Firm* — Alan A. R. Cooper; Wade James Brady, III; Frederick J. Telecky, Jr.

(57) ABSTRACT

A microarray package includes a leadframe having an array of contact posts, a die carried by the lead frame, and a plurality of bonding wires that electrically connect the die to the lead frame. An encapsulant is included that encapsulates the die, the bonding wire and the leadframe while leaving the distal ends of the contact posts exposed and substantially co-planar with a bottom surface of the microarray package. A plurality of pedestal members is plated to the distal end of a respective contact pad. A distal surface of each pedestal member protrudes outwardly beyond the bottom surface of the microarray package in the range of about 15 μm to about 35 μm.

17 Claims, 9 Drawing Sheets

STANDARD PLATING 50 um shear height
Standard MicroArray – 5.25 mm die

| Sample | No. 1 | No 2 | No 3 | No. 4 | No. 5 |
|---|---|---|---|---|---|
|  | 415 | 362 | 391 | 353 | 367 |
|  | 375 | 388 | 366 | 383 | 404 |
|  | 373 | 412 | 398 | 392 | 404 |
|  | 369 | 372 | 375 | 376 | 398 |
|  | 376 | 380 | 385 | 378 | 398 |
|  | 369 | 409 | 397 | 374 | 348 |
|  | 371 | 391 | 386 | 368 | 395 |
|  | 359 | 383 | 367 | 356 | 357 |
|  | 357 | 389 | 370 | 358 | 399 |
|  | 403 | 301 | 390 | 361 | 369 |
| Min | 357 | 301 | 366 | 353 | 348 |
| Max | 415 | 412 | 398 | 392 | 404 |
| Avg | 377 | 379 | 382 | 370 | 384 |
| STD | 19 | 31 | 12 | 13 | 21 |
| Cpk | 3.4 | 2.1 | 5.4 | 4.8 | 3.1 |
| Avg Cpk | 3.8 | | | | |

Failure mold: Intermetallic 46%
Ball Shear 54%

FIG._5A

75 um shear height
Standard MicroArray – 5.5 mm die

| Sample | No. 1 | No 2 | No 3 | No. 4 | No. 5 |
|---|---|---|---|---|---|
|  | 394 | 388 | 368 | 358 | 379 |
|  | 358 | 378 | 369 | 388 | 394 |
|  | 376 | 378 | 393 | 383 | 364 |
|  | 379 | 391 | 369 | 371 | 382 |
|  | 384 | 376 | 389 | 289 | 359 |
|  | 430 | 369 | 369 | 346 | 367 |
|  | 360 | 378 | 348 | 376 | 378 |
|  | 363 | 396 | 340 | 388 | 331 |
|  | 400 | 392 | 363 | 373 | 336 |
|  | 286 | 392 | 366 | 335 | 330 |
| Min | 286 | 369 | 340 | 289 | 330 |
| Max | 430 | 396 | 393 | 388 | 394 |
| Avg | 373 | 384 | 367 | 361 | 362 |
| STD | 37 | 9 | 16 | 31 | 23 |
| Cpk | 1.7 | 7.2 | 3.8 | 1.9 | 2.6 |
| Avg Cpk | 3.4 | | | | |

Failure mold: Intermetallic 54%
Ball shear 46%

FIG._5B

CU +STANDARD PLATING 50 um shear height

| Sample | No. 1 | No 2 | No 3 | No. 4 | No. 5 |
|---|---|---|---|---|---|
| | 400 | 398 | 432 | 455 | 396 |
| | 376 | 386 | 434 | 403 | 398 |
| | 416 | 398 | 448 | 389 | 437 |
| | 426 | 425 | 349 | 405 | 395 |
| | 415 | 433 | 451 | 402 | 451 |
| | 415 | 410 | 409 | 443 | 384 |
| | 439 | 415 | 458 | 419 | 390 |
| | 423 | 373 | 407 | 431 | 437 |
| | 439 | 405 | 452 | 424 | 491 |
| | 408 | 421 | 441 | 394 | 477 |
| Min | 376 | 373 | 349 | 389 | 384 |
| Max | 439 | 433 | 458 | 455 | 491 |
| Avg | 416 | 406 | 428 | 417 | 426 |
| STD | 19 | 18 | 33 | 22 | 38 |
| Cpk | 4.1 | 4.0 | 2.5 | 3.5 | 2.1 |
| Avg Cpk | | 3.2 | | | |

Failure mold: Intermetallic 24%
Ball Shear 76%

FIG._6A

75 um shear height

| Sample | No. 1 | No 2 | No 3 | No. 4 | No. 5 |
|---|---|---|---|---|---|
| | 392 | 392 | 407 | 435 | 395 |
| | 456 | 350 | 366 | 367 | 347 |
| | 397 | 424 | 375 | 373 | 365 |
| | 395 | 395 | 338 | 373 | 353 |
| | 410 | 452 | 405 | 436 | 399 |
| | 420 | 398 | 448 | 413 | 425 |
| | 394 | 421 | 410 | 427 | 408 |
| | 402 | 392 | 396 | 366 | 382 |
| | 385 | 391 | 438 | 420 | 415 |
| | 368 | 417 | 431 | 416 | 416 |
| Min | 368 | 350 | 338 | 366 | 347 |
| Max | 456 | 452 | 448 | 436 | 425 |
| Avg | 402 | 403 | 401 | 403 | 390 |
| STD | 24 | 27 | 34 | 29 | 28 |
| Cpk | 3.1 | 2.7 | 2.1 | 2.5 | 2.5 |
| Avg Cpk | | 2.6 | | | |

Failure mold: Intermetallic 26%
Ball shear 74%

MICROARRAY PACKAGE WITH PLATED CONTACT PEDESTALS

CROSS REFERENCE TO RELATED APPLICATIONS

This application is a Divisional Application which claims priority under 35 U.S.C. §120 from U.S. patent application Ser. No. 11/893,764, filed Aug. 17, 2007, entitled "MICROARRAY PACKAGE WITH PLATED CONTACT PEDESTALS," which is incorporated herein by reference in its entirety.

BACKGROUND

The present invention relates generally to the packaging of integrated circuits in leadframe based microarray packages.

Figure 1:
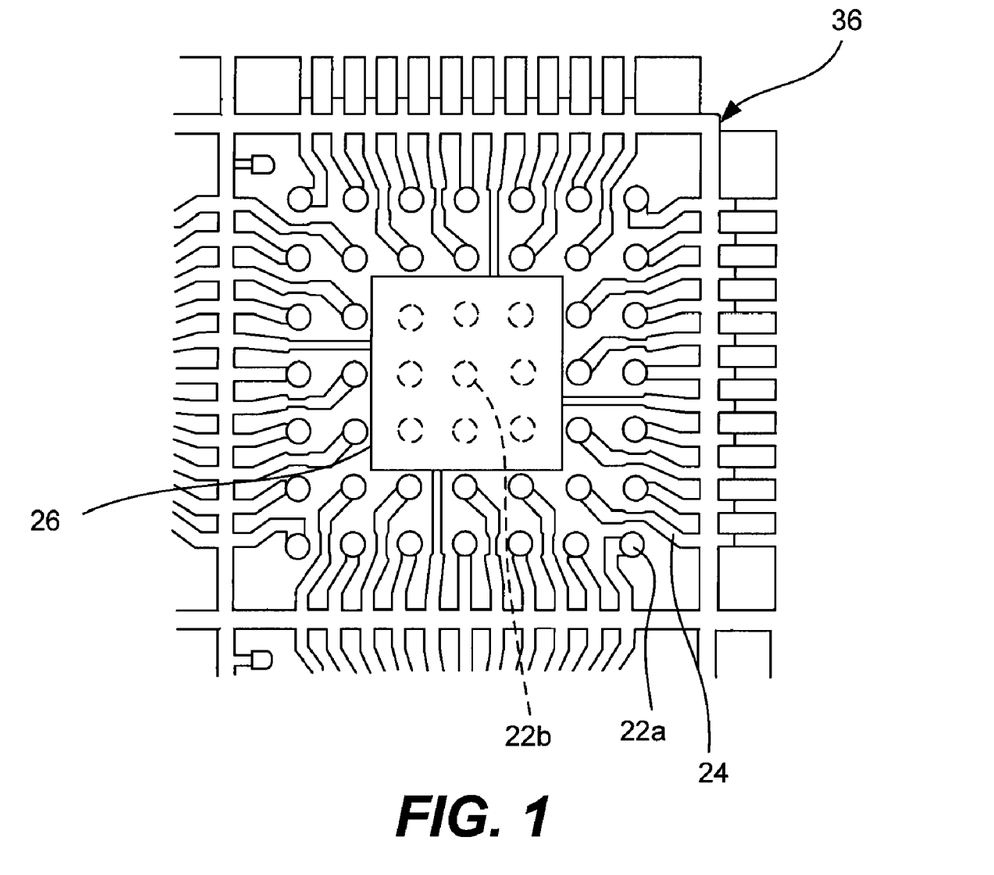
FIG. 1 is a diagrammatic top view of a conventional microarray leadframe.

There are a number of conventional arrangements for packaging integrated circuits. Many packaging techniques use a leadframe that has been stamped or etched from a metal (typically copper) sheet to provide electrical interconnects to external devices. One relatively recently developed packaging style, which is sometimes referred to as a leadframe based microarray package is generally illustrated in FIG. 1. In a microarray package, the leadframe typically includes an array of contact posts 22 that are exposed on the bottom surface of the package and lead traces 24 that may or may not be exposed at the bottom surface of the package. A die mounted on the lead frame is wire bonded (or otherwise electrically connected) to the lead traces, which serve as electrical connectors between the bonding wires and the contact posts 22. Often the microarray package will also have a die support structure 26 that supports the die.

Microarray packages have a number of potential advantages. For example, they are relatively low cost, they may be configured to be pin compatible with conventional BGA packages and they allow a relatively large number of contacts for a given package size. Also, since the lead traces permit "routing" of signals to contact pads located under the die, a package with a relatively smaller footprint may be used for a given die size and pin count as compared to many other leadframe based packages.

As the capacity of these microarray packages increases, the number of contact posts in the array of contact posts likewise multiplies. Consequently, when the microarray packages increase in size, the outermost contact posts (e.g., 22A) are positioned further and further away from a center of the package (e.g., 22B). Hence, due to the geometry and position of the outermost contact posts, the shear and stress levels experienced at these outermost contacts due in-part to operational board level thermo-cycling is significantly more than that experienced at the contact more central to the microarray package. Accordingly, contact failure at such outermost contact interfaces is more prevalent.

Given their many advantages, microarray packages in general have recently generated a great deal of interest within the semiconductor industry. Although existing techniques for fabricating microarray leadframes and for packaging integrated circuits using microarray leadframe technology work well, there are continuing efforts to develop even more efficient designs and methods for packaging integrated circuits using microarray leadframe technology.

SUMMARY

To achieve the foregoing and other objects of the invention, improved arrangements and processes for packaging integrated circuits in microarray packages are described. In a specific embodiment, microarray package is provided that is configured for mounting to a circuit board via a plurality of solder bumps. The microarray package includes a leadframe having an array of contact posts, a die carried by the lead frame, and a plurality of bonding wires that electrically connect the die to the lead frame. An encapsulant material is molded around the die, the bonding wire and the leadframe while leaving respective distal contact pads of the contact posts exposed. These contact pads are oriented so as to be substantially co-planar with a bottom surface of the microarray package. The microarray package further includes a pedestal member that is plated to a bottom of a respective contact pad of one or more contact posts. Each pedestal member protrudes outwardly beyond the bottom surface of the microarray package forming a pedestal bump. Each pedestal is plated to a height that is sufficient such that a respective stress concentration point that was formerly contained in the plane of the solder bump and solder plating interface (i.e., a first solder interface at the bottom surface of the package), in a conventional solder bump mount, is now axially displaced to a different plane that now extends through the pedestal In other words, the ball shear values at the contact pads of the microarray package are significantly improved since the stress concentration points, through the first solder interface where the solder balls primarily attach to the bottom of the microarray package, are axially shifted from an orientation substantially co-planar to the bottom surface of the encapsulant material (i.e., as in the current microarray package designs), to a position extending through the pedestal member. In essence, the solder balls which flows over and around the distal surface of the pedestal members cooperate with the sidewalls of the pedestal members to strengthen mounting to the microarray package, especially, with respect to shear force components in a direction substantially perpendicular to a respective longitudinal axis of the contact posts.

In one specific configuration, a depth of the one or more pedestal members upon which the distal surface protrudes beyond the respective contact pad is in the range of about 15 µm to about 35 µm. In another embodiment, the depth of each pedestal member is in the range of about 20 µm.

In yet another embodiment, the one or more pedestal members are composed of substantially the same material as that of the contact posts. By way of example, the one or more a pedestal members and the contact posts are composed of copper.

To facilitate soldering to the solder balls, a solder plating is plated over the distal surface of the one or more pedestal members.

Another specific arrangement provides a plurality of pedestal members plated to the contact pads of the array of contact posts, and protrude outwardly beyond the bottom surface of the microarray package. Each pedestal is plated to a height that is sufficient such that a respective stress concentration point that was formerly contained in the plane of the first solder interface, in a conventional solder ball mount (i.e., at the bottom surface of the package), is now axially displaced to a different plane that now extends through the pedestal member itself In another aspect of the present invention, a method of packaging integrated circuits includes etching a first side of a metal sheet to define a lead frame panel having a plurality of device areas. Each device area includes an array of contact posts suitable for forming contact pads. The method includes attaching a plurality of dice to the lead frame, wherein each die is mounted on an associated device area, and encapsulating the dice with an encapsulant material. Next, the method includes exposing the contact pads of the contact posts in an orientation substantially co-planar with a bottom surface of the microarray package. The pedestal members are then plated over the respective contact pad of one or more contact posts. Such plating continues until each pedestal member protrudes outwardly beyond the bottom surface of the microarray package by a height sufficiently displacing a respective stress concentration point at the one or more contact pads to a position axially along the respective pedestal member.

BRIEF DESCRIPTION OF THE DRAWINGS

The invention, together with further objects and advantages thereof, may best be understood by reference to the following description taken in conjunction with the accompanying drawings in which:

FIGS. 5A-6B are comparison tables that indicate the increase in ball shear between a standard contact pad/solder ball interface and a plated pedestal member/solder ball interface, in accordance with the present invention.

DETAILED DESCRIPTION OF PREFERRED EMBODIMENTS

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 2:
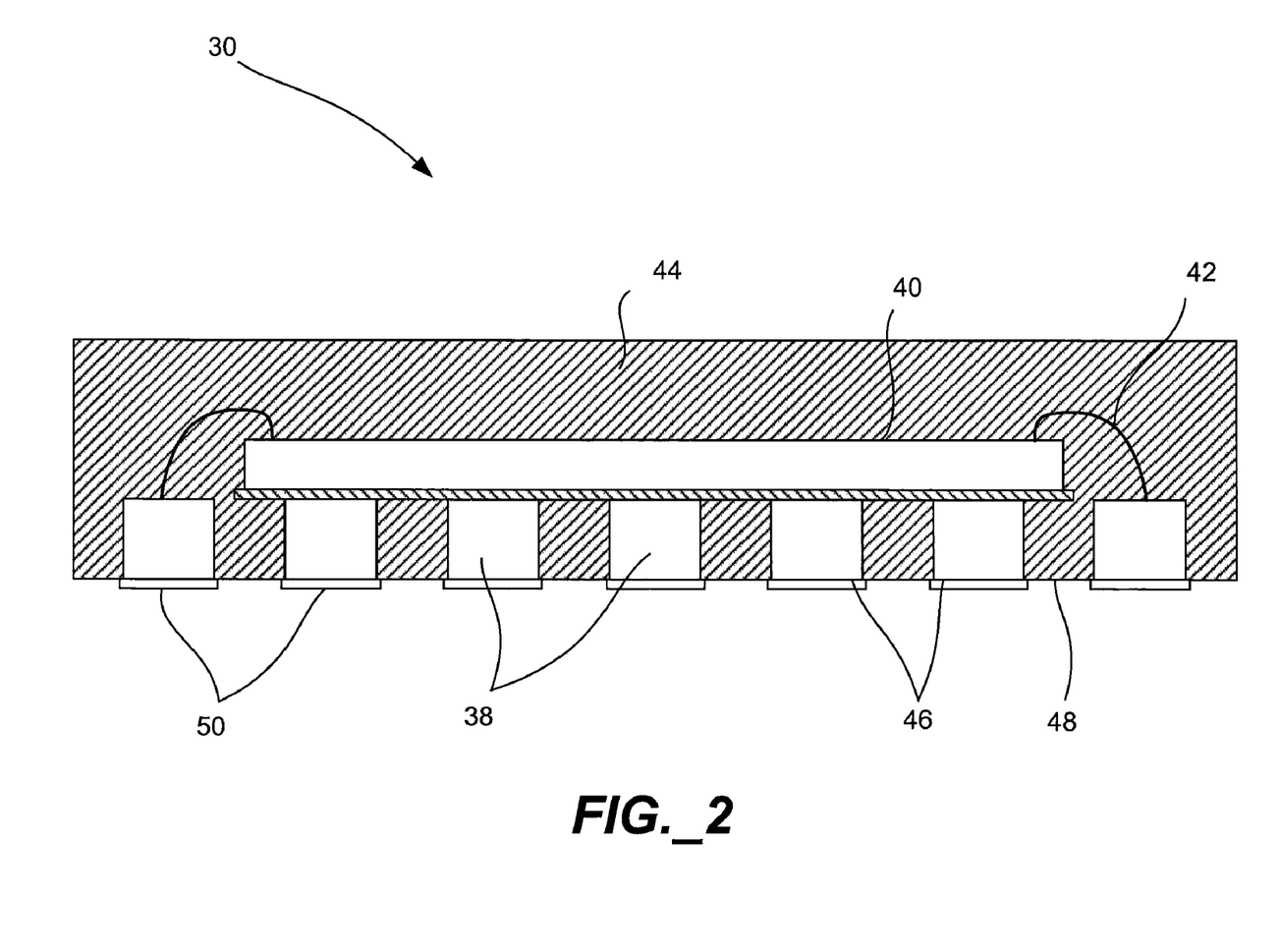
FIG. 2 is a side elevation view, in cross-section, of a microarray package incorporating the plated pedestal members in accordance with the present invention.
Figure 3:
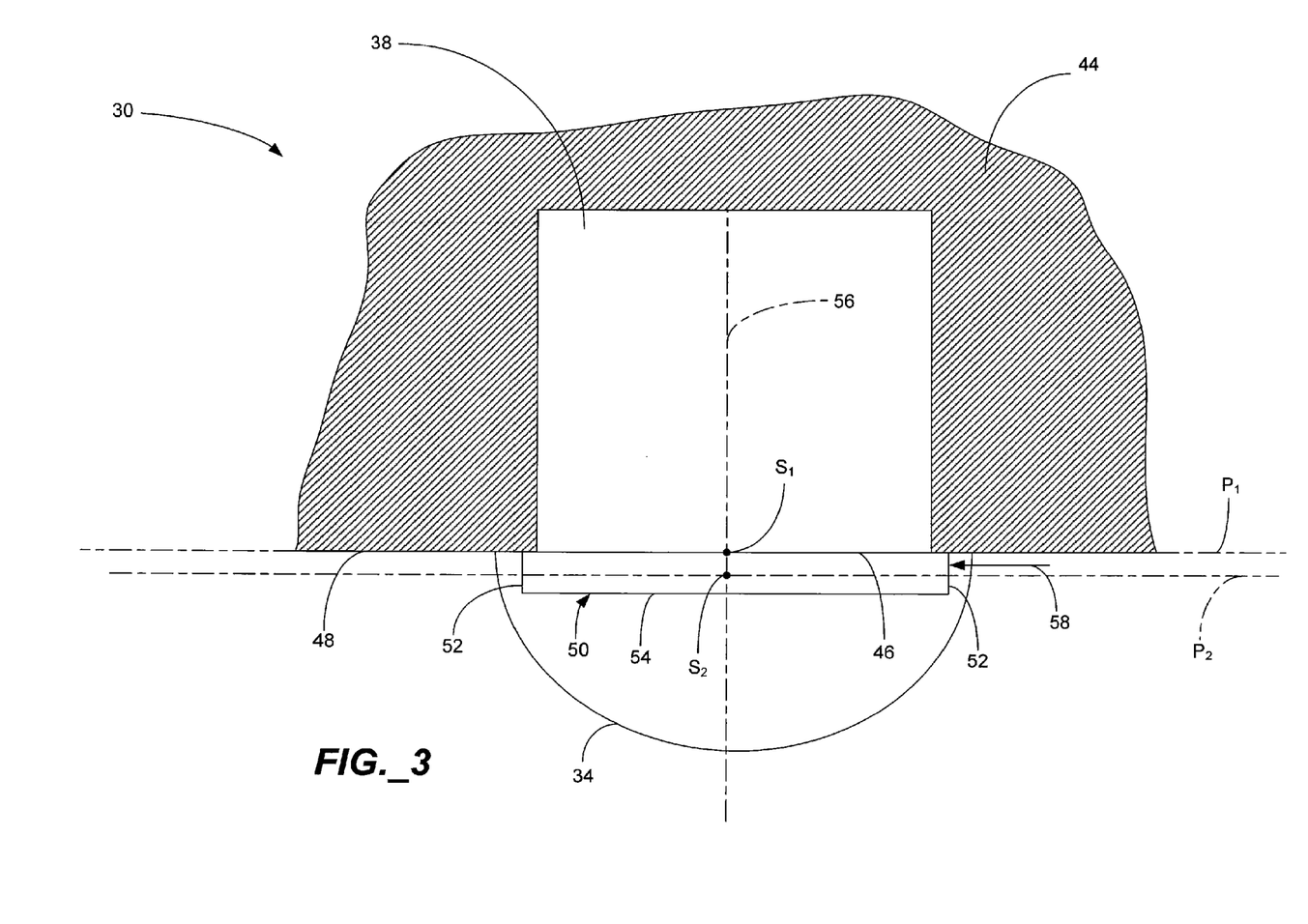
FIG. 3 is an enlarged side elevation view, in cross-section, of one contact post and plated pedestal member of the microarray package of FIG. 2.
Figure 4:
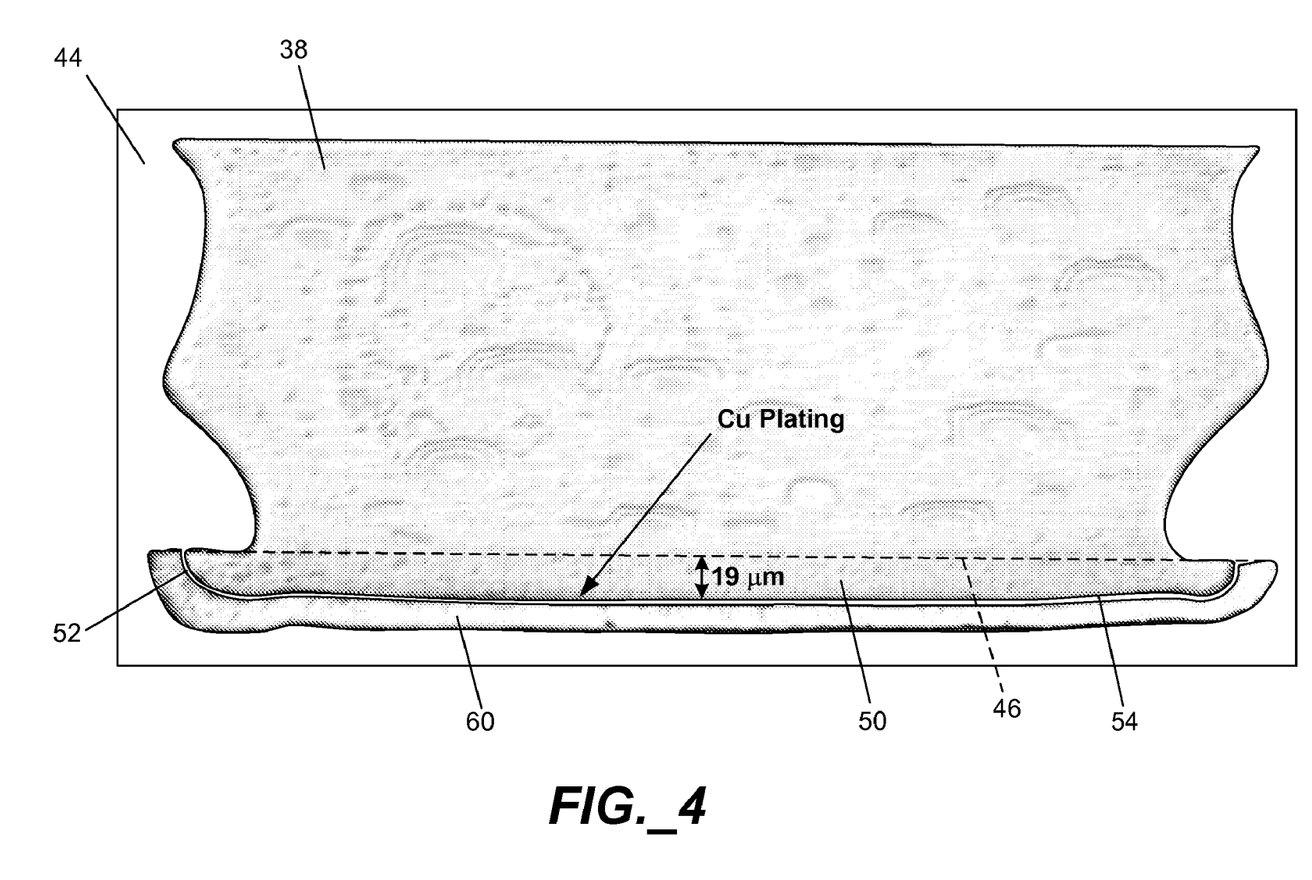
FIG. 4 is a photograph of an enlarged side elevation view, in cross-section, of a contact post of a microarray package incorporating the plated pedestal member over the contact pad, which in turn include a solder plating thereover.
Figure 5A:
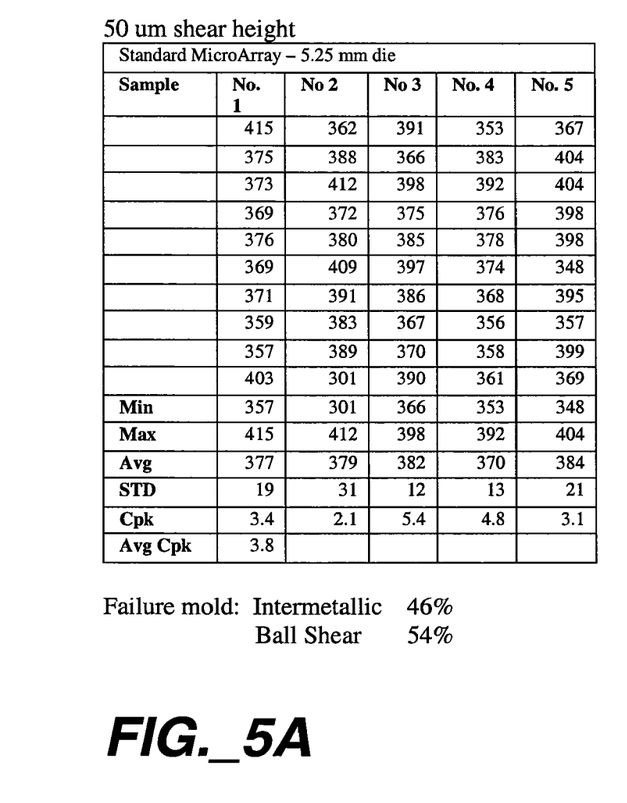
Figure 5B:
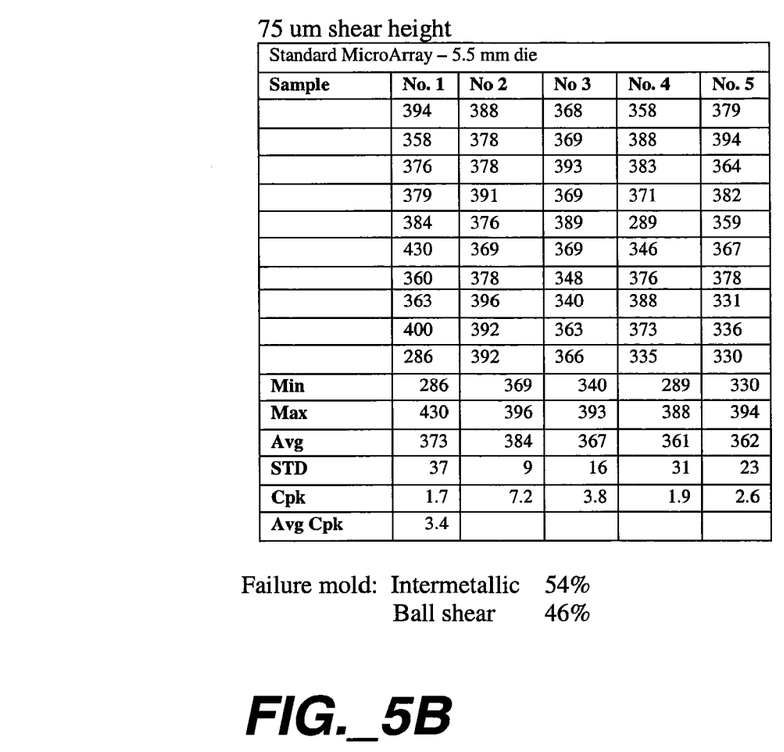
Figure 6A:
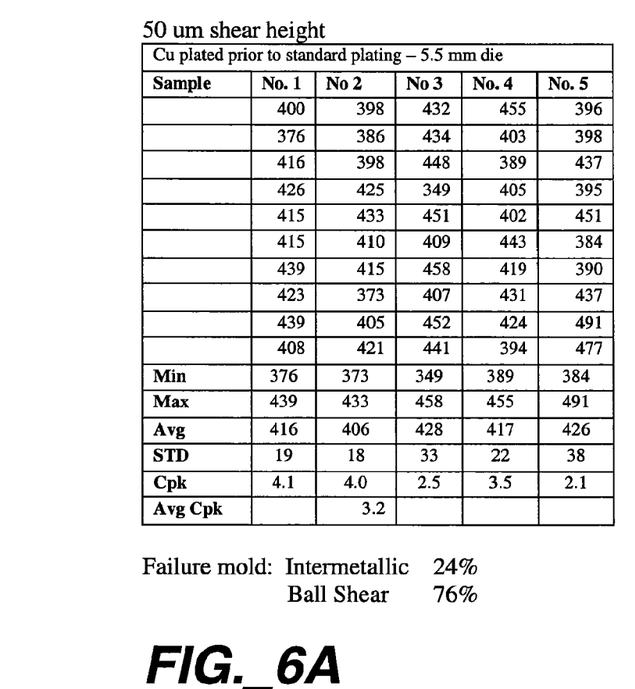
Figure 6B:
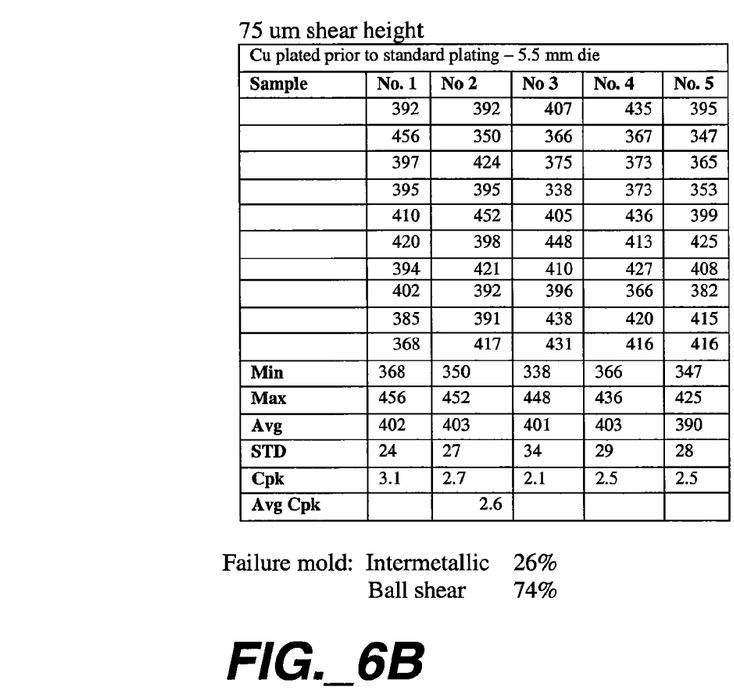

Referring now to FIGS. 2-4, a microarray package, generally designated 30, is provided for mounting to a circuit board (not shown) or the like via a plurality of solder bumps or solder balls 34. The microarray package 30 includes a leadframe, generally designated 36, having an array of contact posts 38, a die 40 carried by the leadframe 36 and a plurality of bonding wires 42 that electrically connect the die 40 to the leadframe 36. An encapsulant 44 is molded around the die, the bonding wire and the leadframe while leaving respective distal contact pads 46 of the contact posts 38 exposed. These contact pads 46 are oriented so as to be substantially co-planar with a bottom surface 48 of the microarray package (FIGS. 2 and 3). The microarray package, in accordance with the present invention, includes a respective pedestal member, generally designated 50, plated to a respective contact pad 46 of one or more contact posts 38. Each pedestal member 50 protrudes outwardly beyond the bottom surface 48 of the microarray package 30 by a height that is sufficient such that a respective stress concentration point ($S_1$) that was formerly contained in a first plane ($P_1$) of a solder bump/solder plating interface (i.e., a first solder interface at the bottom surface 48 of the package), in a conventional solder bump mount, is now axially displaced to a different second plane ($P_2$) that now extends through the pedestal member.

That is, as shown in FIG. 3, a respective first stress concentration point ($S_1$) contained in a first plane ($P_1$) (substantially co-planar with the bottom surface in conventional microarray packages) is displaced to a respective second stress concentration point ($S_2$), axially along the respective pedestal member 50 and that is contained a second plane ($P_2$).

Accordingly, these one or more pedestal members 50 primarily function to increase the mounting integrity between the contact post and the corresponding solder ball 34. As best shown in FIGS. 2 and 3, the pedestal members essentially upstand or protrude beyond the bottom surface of the package encapsulant 44. During a mounting process, as will be described below, the molten solder for the solder balls 34 flow around the distal surface 54 and sidewalls 52 of each of the one or more pedestal members 50. The mounting surface area between each pedestal member 50 and the corresponding solder ball 34, in effect, is increased. Moreover, as shown in FIG. 3, the mounting integrity in any direction perpendicular to the respective longitudinal axis of each contact pad is significantly improved due to the mounting contact, and hence lateral support, with the sidewall 52 of the solder ball 34.

In essence, the stress dynamic are altered to improve the BLR performance. For instance, a first stress concentration point ($S_1$) at a solder ball 34/contact pad 46 interface, typically contained in a plane substantially co-planar with the bottom surface 48 of the microarray package 30 (in a conventional mounting without a pedestal member, in accordance with the present invention), is moved to a different plane (i.e., at a respective second stress concentration point ($S_2$)) than that co-planar with the bottom surface 48 of the microarray package. That is, the stress concentration point is displaced axially along the pedestal member 50, preferably along a longitudinal axis 56 thereof. Accordingly, the shear strength of each pedestal/solder ball interface mount, in directions substantially perpendicular to the longitudinal axis 56 of the pedestal member, is significantly increased due to the lateral support provided by the upstanding sidewalls 52 of the pedestal member 50. Each pedestal member/solder ball mount, hence, exhibits a significant improvement in ball shear values, and consequently, an improvement in board level temperature cycling reliability tests.

By way of example, tests have indicated that the ball shear results have increased an average of about 50 grams per contact, significantly increasing the ball shear mode. This is clearly illustrated in the ball shear comparisons, in FIGS. 5 and 6, of a conventional contact pad/solder ball interface and a plated pedestal/solder ball interface.

Collectively, the greater the number of contact posts 38 that include plated pedestal members, the greater the integrity of mount between the microarray package and the solder balls. Accordingly, it will be appreciated that while the present invention maybe applied selectively to one or more contact posts, it is preferably applied to the entire array of contact posts for practical purposes. Not only does this provide the most stable mounting environment, it is also more cost effective to plate the entire array of contact pads simultaneously than to plate only strategically selected contact pads.

In one specific configuration, a depth of the one or more pedestal members upon which the distal surface protrudes beyond the respective contact pad is in the range of about 15 μm to about 35 μm. Such depth insures sufficient lateral support between the pedestal member sidewall 52 and the solder ball. More preferably, the depth of each pedestal member is in the range of about 20 μm.

Referring back to FIG. 4, an enlarged cross-section of an actual contact post is shown with a pedestal member 50 plated atop the contact pad 46 (illustrated by the broken lines). Using a conventional plating process, such as electroplating, the plated pedestal member 50 typically mushrooms radially, beyond the contact pad 46 in a transverse cross-sectional dimension thereof and in the first plane containing the bottom surface 48 of the microarray package 30. As shown, this formation defines the generally cylindrical sidewalls 52 of the pedestal members. During the solder ball reflow process, to be discussed below, the molten solder flows over the and about the sidewalls 52. Accordingly, such protruding structures provide lateral support and shear strength, for example when a lateral force is applied in the direction of arrow 58 in FIG. 3.

Preferably, the composition of the pedestal member 50 plated over the contact pad 46 is of a material substantially similar to that of the contact post. For example, the pedestal member 50 is preferably composed of copper (Cu), which is the typical or common composition of the contact post. Applying the same or similar material as that of the contact post assures material compatibility, as well as being cost effective, especially for materials such as copper.

Often the leadframe will be formed from a material such as copper that corrodes when exposed to ambient air and/or does not adhere well to certain solders. Therefore, in some situations, it is desirable to plate the exposed distal surfaces of the pedestal members' 50 by applying one or more metallization layers thereon. This additional layer may take the form of an additional underbump or layer of metallization stack, or more tradition lead plating. In one specific embodiment, for instance, a solder plating 60 may be further plated over the distal surface 54 of the pedestal member 50 (FIG. 4).

Accordingly, such additional solder plating 60 functions to protect the exposed distal surface of the pedestal member 50 from oxidation, such as when the pedestals are composed of materials like copper. Consequently, a favorable environment for solder adherence (i.e., with the solder balls 34) is preserved. Such solder plating materials, for example, includes Tin (Sn).

Figure 7:
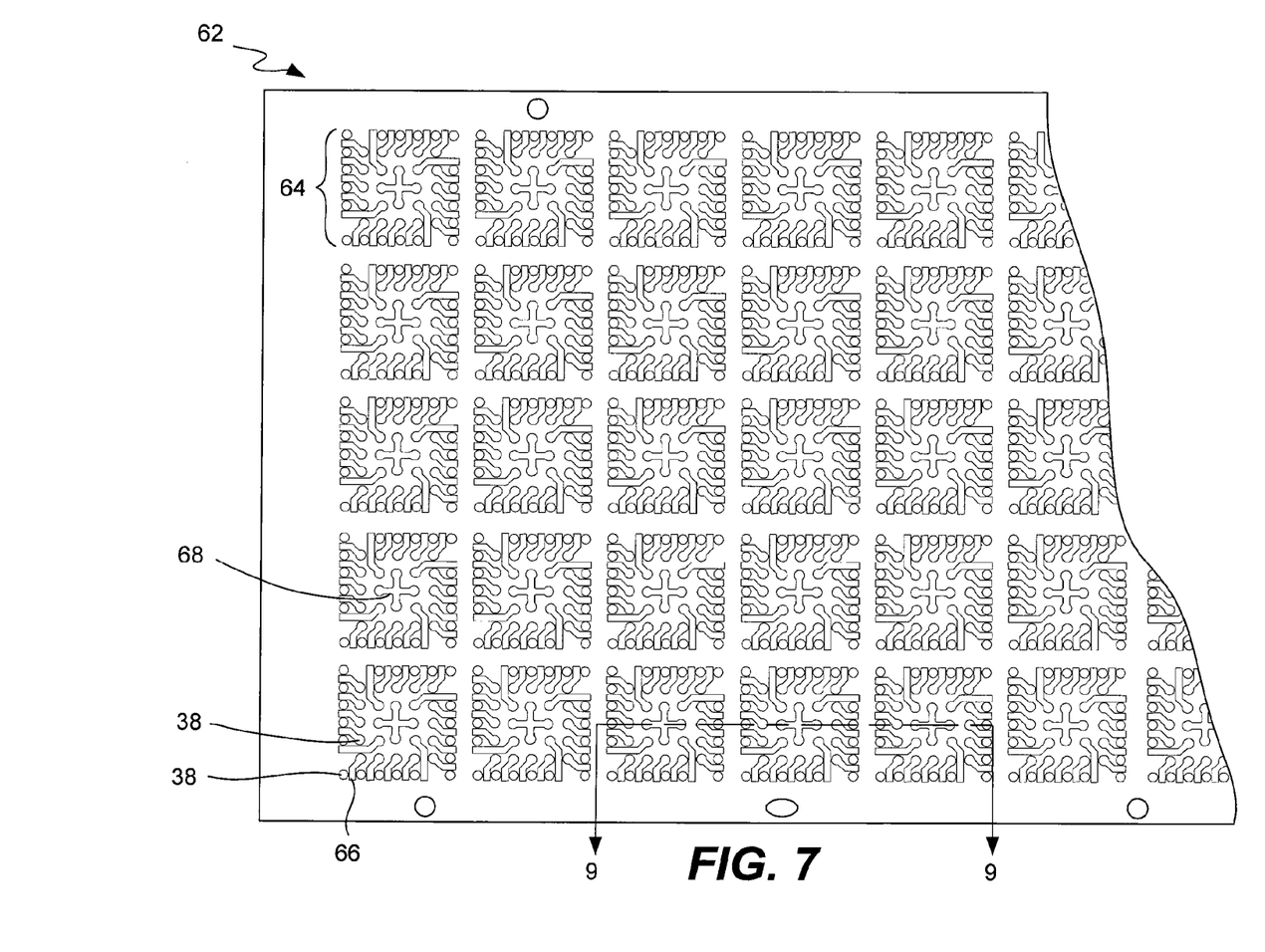
FIG. 7 is a diagrammatic top view of a typical leadframe panel that may be utilized in accordance with one embodiment of the present invention.

Briefly, turning now to FIG. 7, a representative leadframe panel 62 is shown that is patterned to define a two dimensional array of device areas 64. Each device area 64 includes a number of contact posts 38 arranged in a fully populated grid array, a number of lead traces 66 and a die support structure 68. Of course, the size of the grid array can be widely varied depending upon the needs of a particular application and as will be appreciated by those familiar with the art, some of the grid (as for example some of the interior rows) may not be populated or may be replaced by a die support structure such as a die attach pad. Preferably, however, the present invention is particularly suitable for arrays having an array of more than 9×9_ rows and/or more than 81 contacts.

Typically, the contact posts 38 in the outer row of the array are free standing. That is, they are not connected to any lead traces. The contact posts 38 in the middle row, in this example, are all connected to relatively short lead traces 66 that extend towards the outer periphery of the device area 64 such that the ends of the lead traces 66 are positioned between adjacent contact posts 38 in the outer row. Some of the contacts posts 38 in the inner row are connected to slightly longer lead traces 66 that pass between contact posts in the middle row and also extend towards the outer periphery of the device area such that their ends are also positioned between adjacent contact posts in the outer row. Other contact posts 38 in the inner row are part of the die support structure 68, which in the illustrated embodiment takes the form of a cross.

In other embodiments a variety of other layouts and structures may be used within the device areas. For example, in larger devices, it might be desirable to provide two or more rows of freestanding contacts pads. In the illustrated embodiment, only one lead trace is routed between any adjacent pair of contact posts. However, in other implementations it may be desirable or necessary to route two (or more) lead traces between adjacent contact posts. Additionally, a wide variety of die attach structures and geometries can be provided. In some embodiment, it may be desirable to couple the die attach structure to one or more lead traces so that the die attach structure can be used as a ground or power plane. In other embodiments, bus bars or other larger structures may be included as part of the device areas as well.

Figure 8:
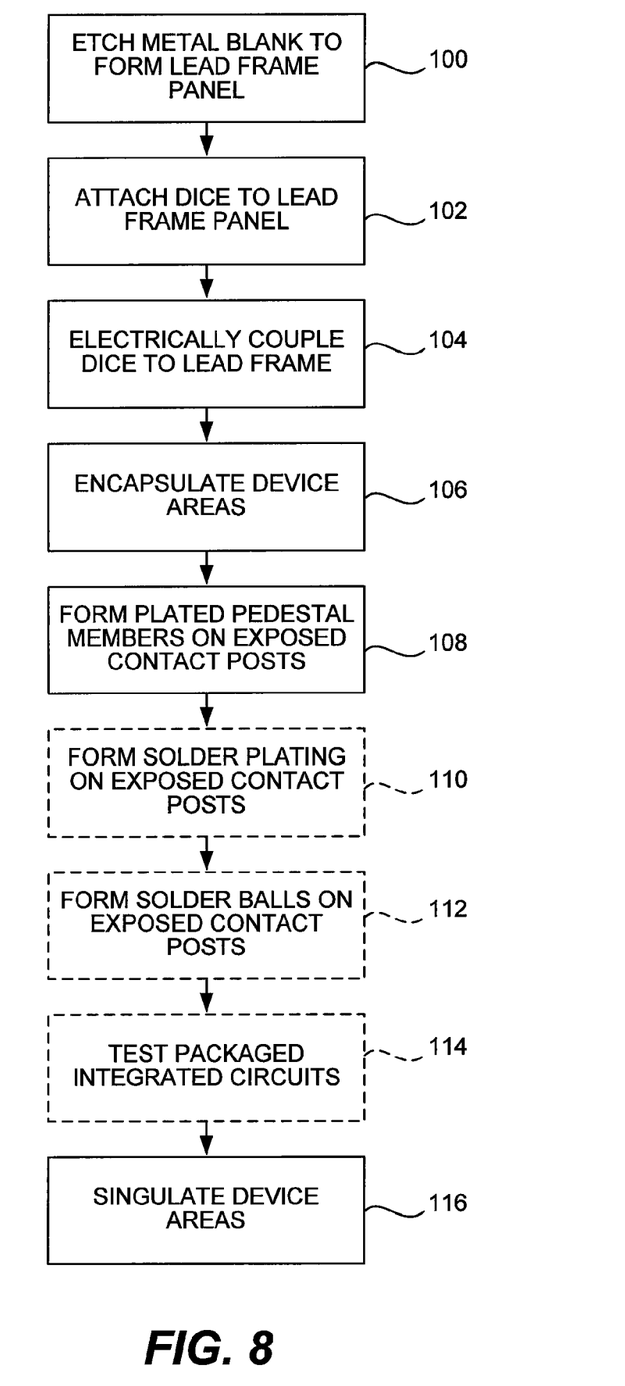
FIG. 8 is a flow chart illustrating a method of packaging an integrated circuit in accordance with one embodiment of the present invention.

Referring next to FIG. 8, in conjunction with FIG. 9A-9D, the leadframe panel 62 is initially fabricated by etching the top surface of a blank leadframe panel to define the desired structures (Step 100). Depending upon the fabrication technique utilized, the etching is controlled so that it etches through all or most of the blank leadframe. Hence, the contact posts are primarily formed, along with their corresponding lead traces 66.

The dice 40 may be attached to each device area (FIG. 9A) using conventional die attach techniques (Step 102). The dice 40 may then be electrically connected to their associated lead traces and contact posts using conventional techniques such as wire bonding 42 (Step 104). Wire bonding can (and typically would) be done directly on contact posts 38 that are not covered by the dice. Contact posts 38 that are covered by the die may be electrically connected to the die by wire bonding to their associated lead traces. Of course, when appropriate, other electrical connection techniques can be used as well. For example, if the die has active connectors (such as a ground electrode) on the backside of the die, such connectors may be directly connected to any appropriate underlying lead frame features. In the illustrated embodiment, bonding wires 42 are used to electrically connect the die to the various contact posts and lead traces.

Figure 9A:
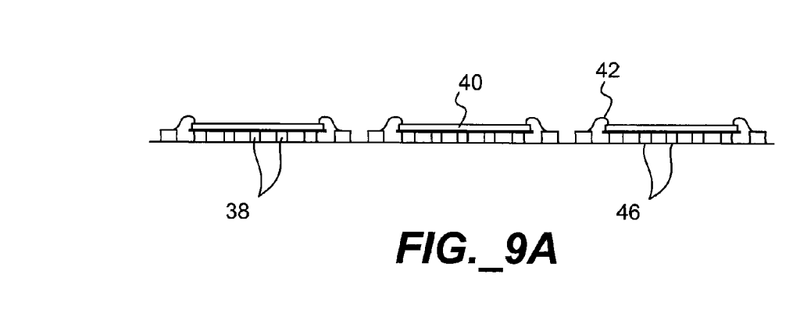
FIG. 9A is a diagrammatic side view of a segment of the leadframe panel taken along the plane of the line 9-9 in FIG. 7, and after a die has been mounted thereon and electrically connected to the leadframe.
Figure 9B:
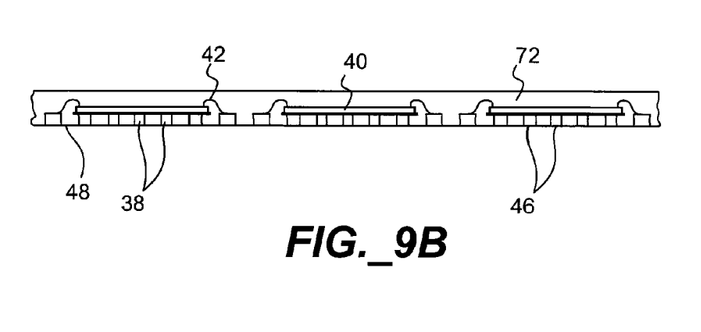
FIG. 9B is a diagrammatic side view of the leadframe illustrated in FIG. 9A after encapsulation.
Figure 9C:
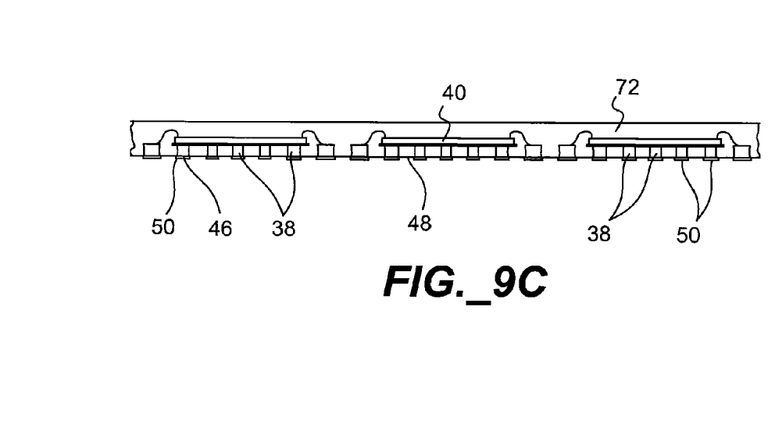
FIG. 9C is a diagrammatic side view of the leadframe illustrated in FIG. 9B after plating of the pedestal members.

After the dice 40 have been attached and electrically connected to the lead frame panel, the device areas 64 are encapsulated as best illustrated in FIG. 9C (Step 106). A wide variety of standard encapsulation techniques may be used to encapsulate the device areas. In the illustrated embodiment, an encapsulant cap 72 is molded over the entire two-dimensional array of device areas. However, a variety of other known encapsulations techniques such as topping, screen printing, or stencil printing may be used to encapsulate the device areas. Generally, it is desirable for the encapsulant to cover all of the device areas in a manner holding all of the devices together. However, in other embodiments, the device areas could be individually molded (e.g., by using a mold having an array of cavities that are designed to match the device areas), or group molded in several different blocks (e.g., with each block having a two dimensional array of device areas).

Encapsulant material that overlies etched regions of the lead frame panel that are outside of the device areas (e.g. molding material overlying side and end regions of the lead frame panel (not shown) can be used to facilitate handling of the panels after the connecting sheet has been sacrificed. Of course, the leadframe panel can be designed to incorporate spaces between or adjacent selected device areas as appropriate to create any handling features that are desired on the encapsulated panel.

Once the panel has been encapsulated, the bottom surface 48 of the microarray packages 20, together with the corresponding contact pads 46, can be exposed using conventional techniques such as a deflash process to remove any residual encapsulate material at the bottom surface thereof. As mentioned, preferably, the bottom surface 48, along with the contact pads 46 of the contact posts, are substantially co-planar. Other conventional processes can be applied to expose of the bottom surface 48, such as grinding or etching.

Once the bottom surface 48 and contact pads 46 are exposed, in accordance with the present invention, the pedestal members 50 can be simultaneously plated over all the contact pads, as shown in FIG. 9C (Step 108). For example, applying a conventional plating technique, such as electroplating, the pedestal member can be formed.

As set forth above, it is often desirable to prevent oxidation of the exposed contact surfaces. Thus, once the pedestal member plating procedure is completed, a solder plating procedure (Step 110) is performed to protect exposure of the contact pads by a material less susceptible to oxidation.

In some configurations, it is desirable to form solder bumps or solder balls 34 (FIG. 9D and Step 112) on each of the contact posts (i.e., bump the devices) while still in panel form. This solder ball attach technique provides devices that look very similar to conventional BGA or other grid array type packages. It is also this step were the molten solder flows over the distal surface 54 and sidewalls of the pedestal members 50. It will be appreciated, of course, that the solder plating layer 60 may be disposed therebetween.

Figure 9D:
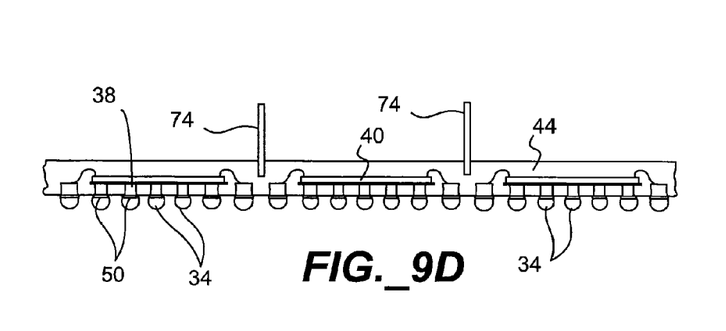
FIG. 9D is a diagrammatic side view of the leadframe illustrated in FIG. 9C with solder balls attached to the pedestal members.

After all of the panel level processing has been completed, the panel may be tested (Step 114), and then cut in order to singulate the individual packaged devices, as diagrammatically illustrated in FIG. 9D (Step 116). A variety of different cutting techniques can be used, as for example, sawing, laser cutting, etc. In the embodiment illustrated in FIG. 9D, gang cutters having a plurality of saw blades 74 are used. It should be appreciated that with the primary described embodiment, there is no metal along the cutting lines between adjacent device areas after the connecting sheet has been sacrificed. Therefore, only the relatively soft encapsulant material needs to be cut through, which can help improve blade life of the saws used to separate the different packages when compared to the singulation of conventional leadframe based packages. It also makes the panel especially well adapted for laser cutting since there is not any metal that needs to be cut through. After the packages have been separated, any desired device level processing and/or additional testing may be performed and the packaging process is complete.

Although only a few embodiments of the invention have been described in detail, it should be appreciated that the invention may be implemented in many other forms without departing from the spirit or scope of the invention. Although specific leadframe features have been described (such as contact posts, lead traces, and die attach structures), it should be appreciated that a wide variety of leadframe structures can be applied. The described etching based approach can be used to produce leadframe features having virtually any desired footprint. Thus, the geometry of the contact posts and other structures may be varied as appropriate for a particular application. For example, in the illustrated embodiments, the contact posts have a substantially round footprint. However, in other embodiments, alternative cross section geometries, such as square, rectangular or oval footprints may be formed.

The invention claimed is:

1. A method of packaging integrated circuits comprising:
providing a lead frame panel having a plurality of device areas, each device area including an array of contact posts suitable for forming contact pads;
attaching a plurality of dice to the lead frame, wherein each die is mounted on an associated device area;
encapsulating the dice with an encapsulant material;
exposing a distal surface of the contact pads of the contact posts in an orientation substantially co-planar with a bottom surface of the microarray package such that the contact pads have a first stress concentration point; and
after said encapsulating, lowering the first stress concentration point associated with one of the contact pads such that a lowered stress concentration point is formed for said contact pad outside the encapsulated package and below the first stress concentration point by forming a pedestal member over the distal surface of the respective contact pad such that said pedestal member protrudes downward below the bottom surface of the microarray package by a height sufficient to displace the lowered stress concentration point a specified distance below the first stress concentration point and below the bottom surface of the microarray package,
wherein said forming of the pedestal is accomplished by plating the one or more pedestal member to a depth upon which the distal surface protrudes beyond the respective contact pad in the range of about 15 μm to about 35 μm.

2. The method of claim 1, wherein
said plating further includes plating the one or more pedestal member to a depth upon which the distal surface protrudes beyond the respective contact pad in the range of about 20 μm.

3. The method as recited in claim 1, further including:
plating a solder plating over a distal surface of the one or more pedestal member.

4. The method as recited in claim 1, wherein the contact pads are formed of a first material and the plated pedestal comprises a second material, wherein the first and second materials comprise substantially the same material.

5. The method as recited in claim 4, wherein the first and second materials both comprise copper.

6. The method as recited in claim 3, wherein the pedestal is formed having a bottom surface and a sidewall and wherein said solder plating covers the sidewall.

7. The method as recited in claim 6, wherein the pedestal sidewall is substantially cylindrical and the solder plating material comprises at least one of lead or tin.

8. A method of forming a solder bump based microarray package, comprising:
providing a leadframe panel having a plurality of device areas, each device area including an array of contact pads suitable for forming contact pads, the contact pads formed of a first material;

attaching a plurality of dice to the leadframe, wherein each die is mounted on an associated device area of the leadframe;

encapsulating the die and the leadframe with an encapsulant while leaving said plurality of contact pads exposed and substantially co-planar with a bottom surface of a plurality of microarray packages;

plating the contact pads with a second material, after said encapsulation, to form a plurality of pedestal members on the contact pads such that the pedestal members comprise the second material and each protrude outwardly beyond the bottom surface of the microarray packages by a first height, each said pedestal member comprising a distal surface and sidewalls, wherein said plating is to a first height that is sufficient to support a subsequently formed solder bump to enable a stress to be shifted from a first stress concentration point at a contact pad interface axially from a first plane extending along the bottom surface of the microarray package to a second stress concentration point at a second plane that is axially displaced from the bottom surface of the microarray package; and forming a plurality of solder bumps, each solder bump being formed over the distal surface and the sidewalls of an associated one of said pedestal members such that none of said associated pedestal member is exposed to the outside of the microarray package, such that the stress concentration point of each solder bump is shifted to second stress concentration point at a second plane that is axially displaced from the bottom surface of the microarray package, wherein the first and second materials comprise substantially the same material.

9. The method of claim 6, wherein the first and second materials both comprise copper.

10. The method as recited in claim 8, wherein the pedestal is formed having a bottom surface and sidewalls and wherein said solder plating covers sidewalls.

11. The method as recited in claim 9, wherein,
said plating to form the pedestal comprises copper plating each exposed contact pad so that the pedestal member protrudes outwardly beyond the bottom surface of the microarray package by a height of about 15 μm to about 35 μm thereby forming the distal surface of the pedestal member and sidewalls of the pedestal;
and further comprising,
plating a tin-based solder material over the distal surface of the pedestal; and
flowing molten solder over the tin plated distal surface of the pedestal and the sidewalls of the pedestal member to form a solder ball.

12. A method of packaging integrated circuits comprising:
providing lead frame panel having a plurality of device areas, each device area including an array of contact posts suitable for forming contact pads comprised of a first material;
mounting a plurality of dice with the lead frame, wherein each die is mounted on an associated device area;
encapsulating the dice with an encapsulant material;
exposing the contact pads of the contact posts in an orientation substantially co-planar with a bottom surface of the encapsulant material;
plating a second material that is substantially the same as the first material onto a respective one of the contact pads to form a pedestal that protrudes outwardly beyond the bottom surface by a specified height.

13. The method as recited in claim 12 wherein the first and second materials comprise a substantially copper material.

14. The method as recited in claim 12 further comprising mounting a solder ball at a distal portion of the pedestal.

15. The method as recited in claim 12 further comprising plating a layer of a third material onto the protruding portion of the pedestal.

16. The method as recited in claim 15 wherein the third material comprises one of tin or lead.

17. The method as recited in claim 15 further comprising mounting a solder ball on the layer of the third material of the pedestal.

* * * * *